(12) United States Patent
Scott

(10) Patent No.: US 11,481,009 B1
(45) Date of Patent: Oct. 25, 2022

(54) HOST ELECTRONIC DEVICE HAVING A MOVABLE COOLING COMPONENT FOR REMOVABLE ELECTRONIC DEVICE

(71) Applicant: HEWLETT PACKARD ENTERPRISE DEVELOPMENT LP, Houston, TX (US)

(72) Inventor: Michael Scott, Chippewa Falls, WI (US)

(73) Assignee: Hewlett Packard Enterprise Development LP, Houston, TX (US)

(*) Notice: Subject to any disclaimer, the term of this patent is extended or adjusted under 35 U.S.C. 154(b) by 1 day.

(21) Appl. No.: 17/237,529

(22) Filed: Apr. 22, 2021

(51) Int. Cl.
*G06F 1/20* (2006.01)
*H05K 7/20* (2006.01)
*G06F 1/18* (2006.01)

(52) U.S. Cl.
CPC ............... *G06F 1/20* (2013.01); *G06F 1/183* (2013.01); *H05K 7/20263* (2013.01)

(58) Field of Classification Search
CPC . G06F 1/20; G06F 1/183; G06F 1/187; G06F 1/1632; G06F 2200/201; G06F 1/206; G06F 1/181; H01L 2023/4081; H01L 23/473; G11B 33/128; G11B 17/056; H05K 5/0286; H05K 1/0203; H05K 7/1487; H05K 7/20254; H05K 7/2049; H05K 9/0058; H05K 1/141; H05K 5/0039; H05K 7/1418; H05K 7/20509; H05K 9/0016; H05K 7/20772; H05K 7/2039; H05K 7/20154

USPC ....... 361/699, 719, 702, 688, 704, 711, 715, 361/679.31, 679.33, 679.54, 725; 165/80.4, 104.33, 80.2; 257/719, 718, 257/714

See application file for complete search history.

(56) References Cited

U.S. PATENT DOCUMENTS

| | | | |
|---|---|---|---|
| 6,724,628 B2 | 4/2004 | Franz et al. | |
| 7,405,931 B2 * | 7/2008 | Saturley | G06F 1/20 361/679.48 |
| 7,448,921 B2 * | 11/2008 | Kim | H05K 5/0286 439/744 |
| 7,625,223 B1 * | 12/2009 | Fogg | H05K 5/0247 439/607.3 |
| 7,753,703 B2 | 7/2010 | Liao et al. | |

(Continued)

FOREIGN PATENT DOCUMENTS

EP 2248230 A1 11/2010

*Primary Examiner* — Mandeep S Buttar
(74) *Attorney, Agent, or Firm* — Hewlett Packard Enterprise Patent Department

(57) ABSTRACT

Example implementations relate to a host electronic device and a method of establishing a thermal contact with a removable electronic device by a cooling component of the host electronic device. The host electronic device includes a housing, the cooling component, and a plurality of flexible arms. The cooling component is movably coupled to the housing. The plurality of flexible arms extend towards an internal cavity of the housing to hold the cooling component in a first position (retracted position). Further, the plurality of flexible arms are displaceable from the internal cavity by a movement of the removable electronic device into the host electronic device, to allow the cooling component to drop down to a second position (extended position) for establishing the thermal contact with a heat generating component of the removable electronic device.

20 Claims, 9 Drawing Sheets

(56) References Cited

U.S. PATENT DOCUMENTS 8,526,175 B2 9/2013 Yukawa et al.
9,781,857 B2 10/2017 Jau et al.

* cited by examiner

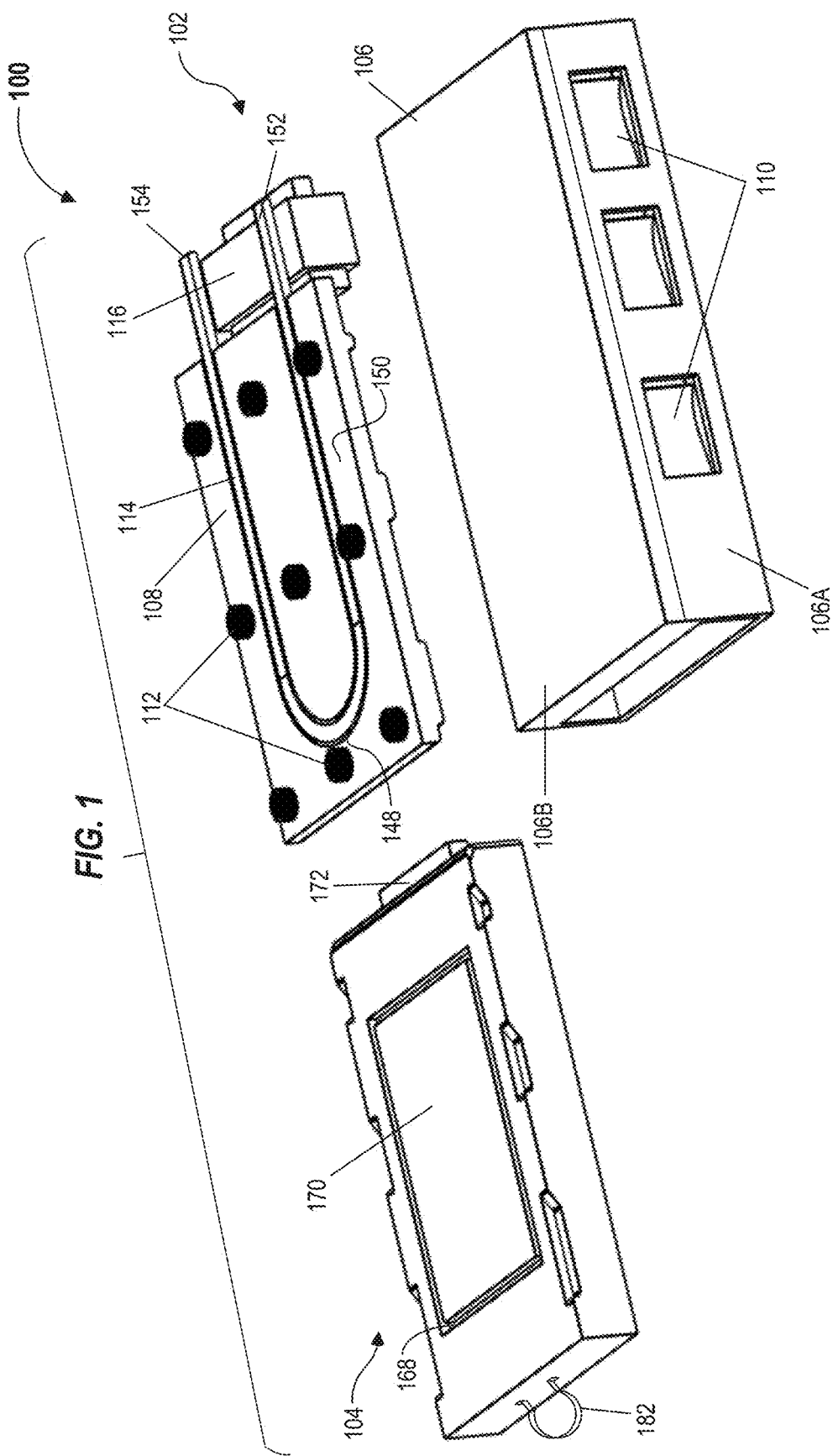

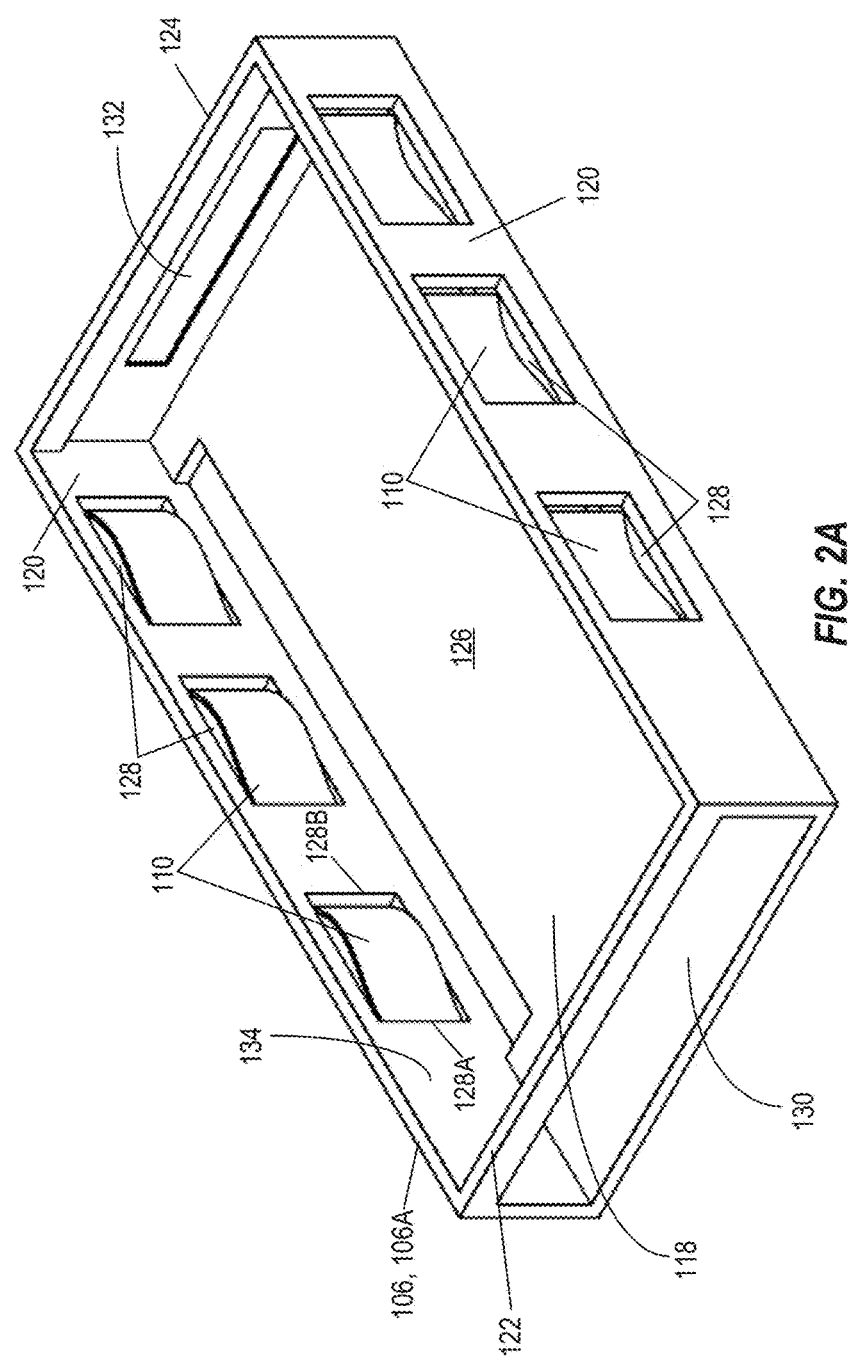
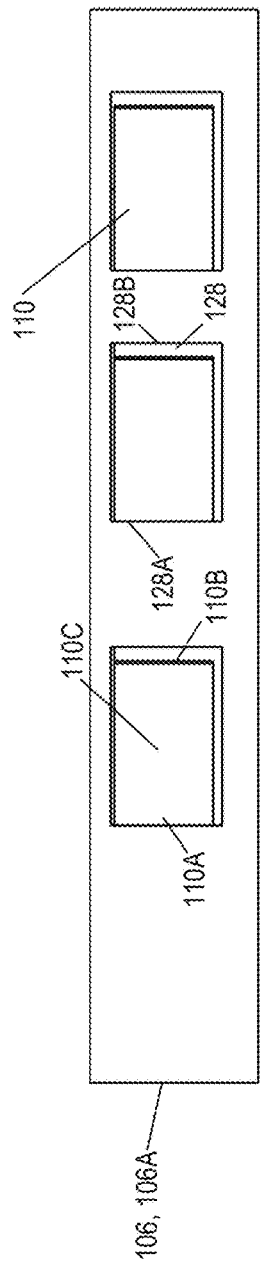
FIG. 2A
FIG. 2B

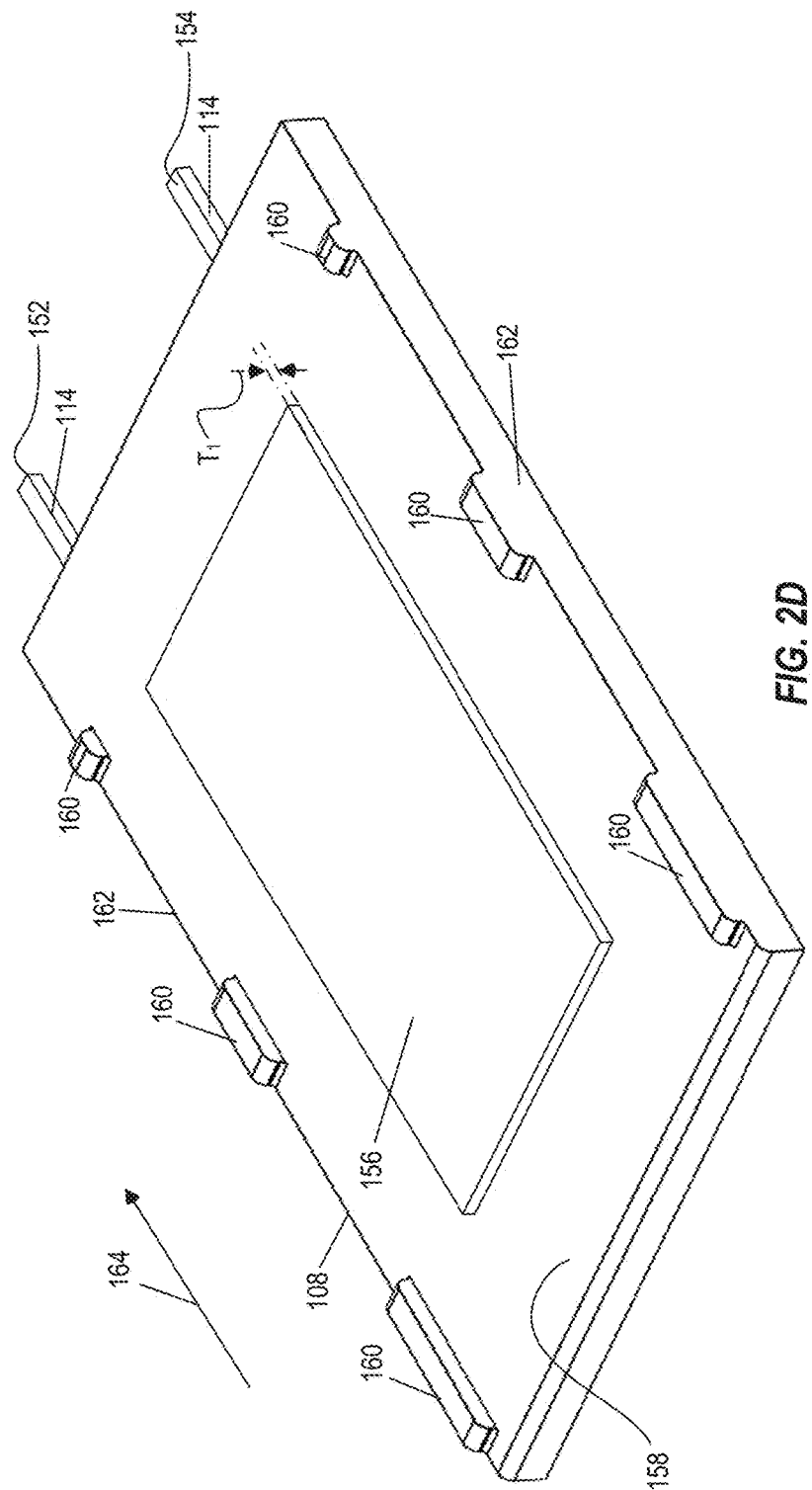
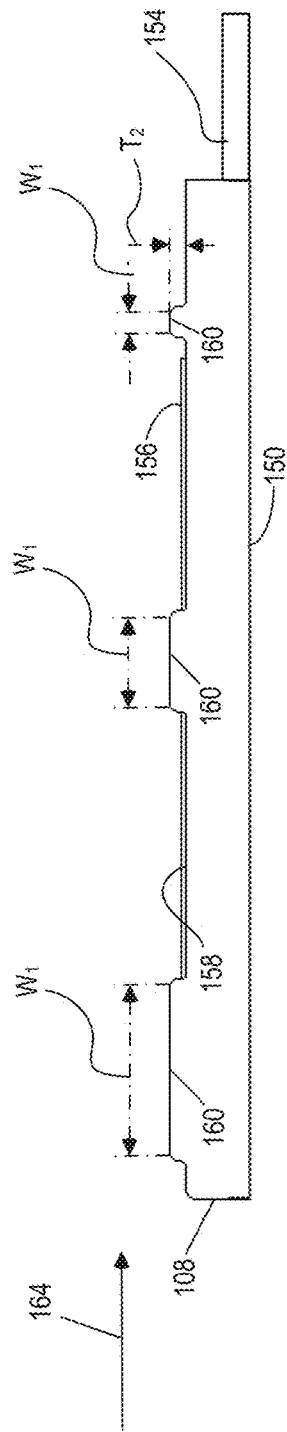
FIG. 2D
FIG. 2E

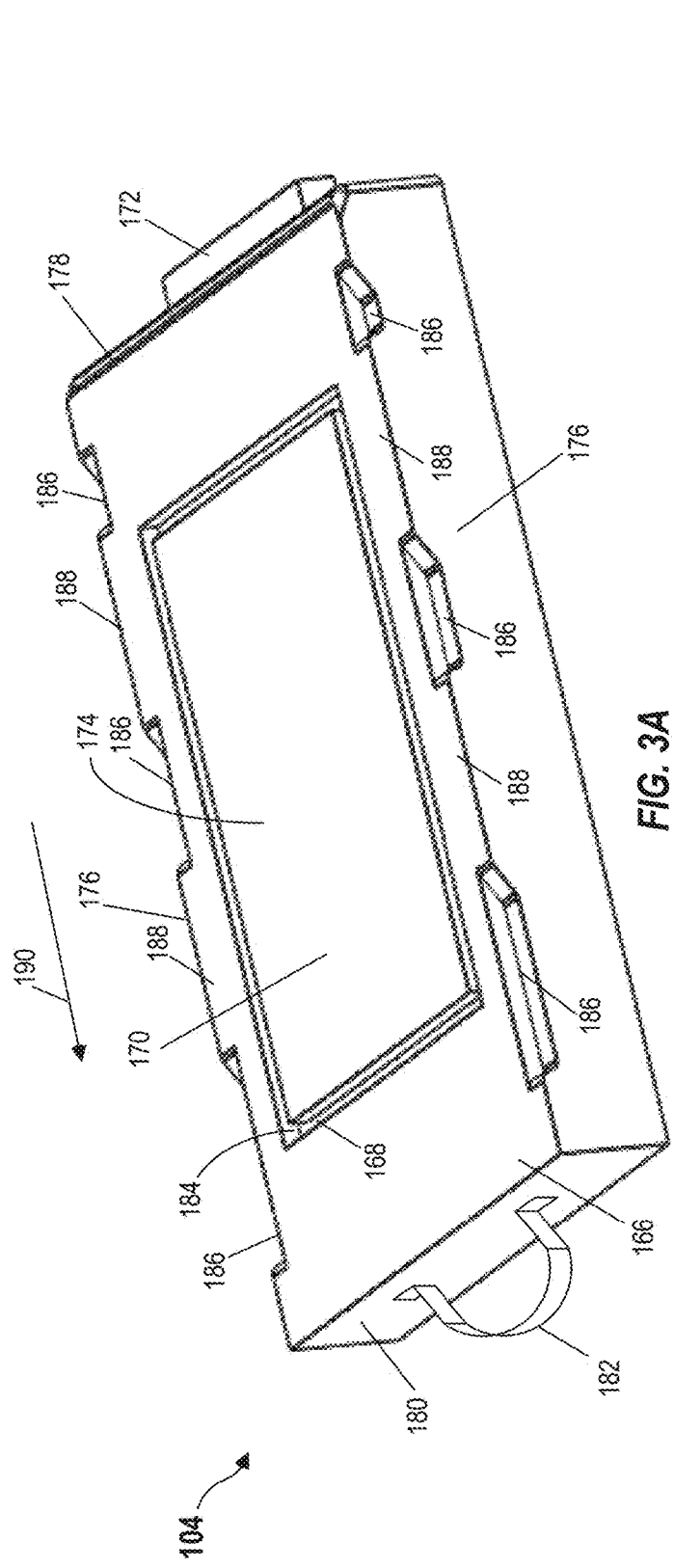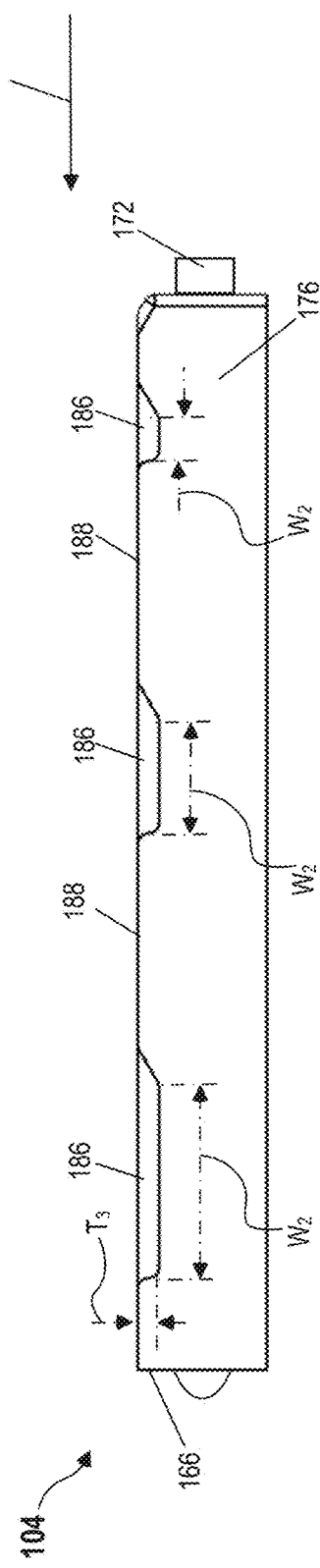

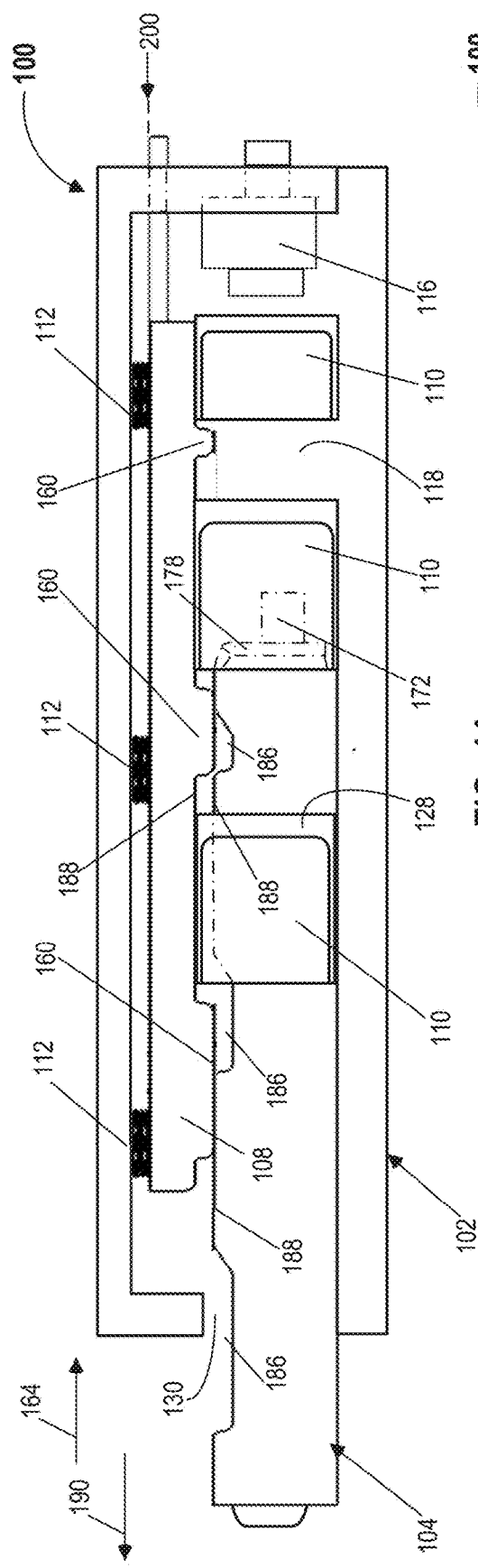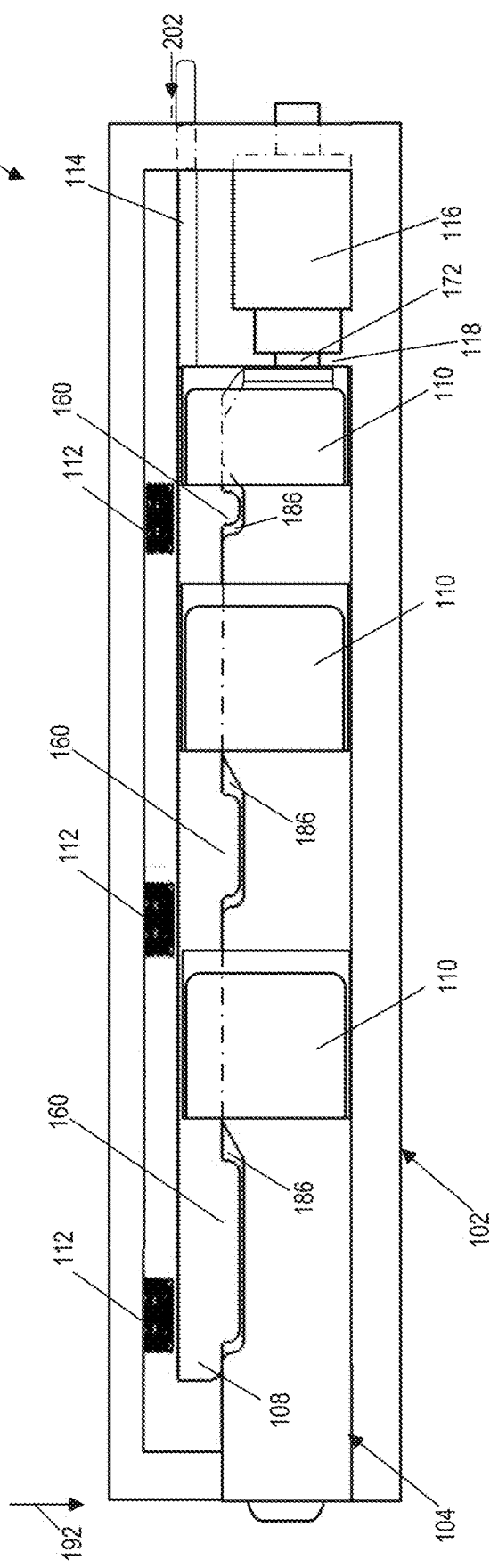

HOST ELECTRONIC DEVICE HAVING A MOVABLE COOLING COMPONENT FOR REMOVABLE ELECTRONIC DEVICE

BACKGROUND

A removable electronic device, such as a small form-factor removable (SFP) transceiver device or a non-volatile memory express (NVMe) storage drive may be connected to a host electronic device, such as server for performing functions, such as transmitting data, receiving data, processing data, storing data, or the like. Thus, the removable electronic device may generate excessive waste-heat, while performing its respective functions. If adequate amount of the waste-heat is not dissipated from the removable electronic device, it may exceed thermal specifications of the removable electronic device, and thereby degrade the performance, reliability, and/or life expectancy of the removable electronic device, and may also cause its failure. Thus, the host electronic device may provide a cooling solution for regulating the waste-heat generated by the removable electronic device. For example, the host electronic device may establish a thermal path from the removable electronic device for dissipating the waste-heat from the removable electronic device.

BRIEF DESCRIPTION OF THE DRAWINGS

Various examples will be described below with reference to the following figures.

FIG. 1 illustrates an exploded perspective view of a computing system having a host electronic device and a removable electronic device according to an example implementation of the present disclosure.

FIG. 2A illustrates a perspective view of a container portion of a housing and a plurality of flexible arms of the host electronic device of FIG. 1 according to an example implementation of the present disclosure.

FIG. 2B illustrates a side view of the container portion of the housing and the plurality of flexible arms of FIG. 2A according to an example implementation of the present disclosure.

FIG. 2D illustrates a perspective view of a cooling component of FIG. 1 according to an example implementation of the present disclosure.

FIG. 2E illustrates a side view of the cooling component of FIG. 2D according to an example implementation of the present disclosure.

FIG. 3A illustrates an assembled perspective view of the removable electronic device of FIG. 1 according to an example implementation of the present disclosure.

FIG. 3B illustrates a side view of the removable electronic device of FIG. 3A according to an example implementation of the present disclosure.

FIG. 4A illustrates a block diagram of the computing system of FIG. 1 having the removable electronic device connecting to the host electronic device according to an example implementation of the present disclosure.

FIG. 4B illustrates a block diagram of the computing system of FIG. 1 having the removable electronic device connected to the host electronic device according to an example implementation of the present disclosure.

DETAILED DESCRIPTION

Figure 2C:
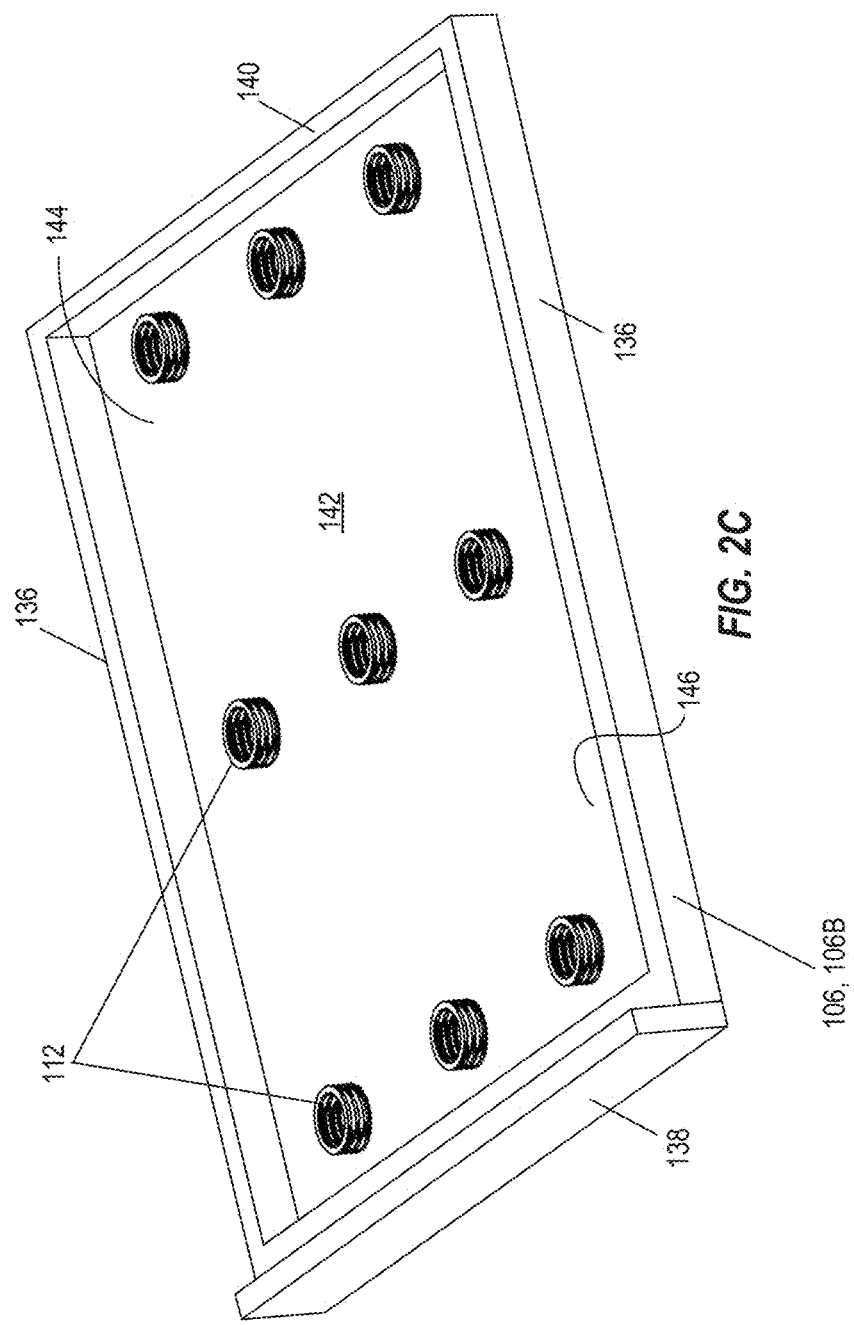
FIG. 2C illustrates a perspective view of a cover portion of the housing and a plurality of biasing members of the host electronic device of FIG. 1 according to an example implementation of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening element, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, and the term "including" means including but not limited to. The term "based on" means based at least in part on.

As used herein, the term "host electronic device" may refer to a type of computing device having a receptacle to receive and detachably connect to a connector of a removable electronic device. For example, the host electronic device may be a server device, a storage device, a power conversion device, or a networking device, or the like. As used herein, the term "removable electronic device" may refer to a type of pluggable device (swappable device), which is not native to the host electronic device, and which has to be inserted to detachably connect to the host electronic device. For example, the removable electronic device may be a transceiver device or a storage drive, or the like. As used herein, the term "computing system" may refer to a type of compute infrastructure, where the host electronic device and the removable electronic device may function as a socket and a plug, respectively. Further, as used herein, the term "movably coupled" refers to attaching a cooling component to a housing such that the cooling component can be moved between a first position and a second position, along a direction, which is perpendicular to a direction of a movement of the removable electronic device into the host electronic device. As used herein, the term "first position" may refer to a retracted position relative to the movement of the removable electronic device into the host electronic device. As used herein, the term "second position" may refer to an extended position relative to the movement of the removable electronic device into the host electronic device. As used herein the term "biasing member" may refer to an elastic member that stores potential energy when it is compressed, stretched, or bent, and releases the stored potential energy when the restraining force is removed. For example, the biasing member may be a coil, a strip of steel, a wave spring, or the like. As used herein, the term "drop down" may refer to moving the cooling component vertically downwards. Similarly, the term "move up" may refer to moving the cooling component vertically upwards.

Further, as used herein, the term "thermal contact" may refer to forming a thermal interface between surfaces of two components to allow the transfer of waste-heat there between the two components. As used herein the term "cooling component" may refer to a type of thermally conductive component that contains fluid conduits to circulate liquid coolant for absorbing the waste-heat that is transferred to the cooling component from a heating component. Further, the term "heating component" may refer to a type of a passive heat exchanger that transfers the waste-heat generated by a heat generating component to the cooling component. As used herein the term "heat generating component" may refer to a circuit board of the removable electronic device, or one or more electronic components mounted on the circuit board. It may be noted herein: an object, device, or assembly (which may comprise multiple distinct bodies that are thermally coupled, and may include multiple different materials), is in "thermal contact" or is "thermally conductive" between two surfaces (that form the interface), if any one of the following is true: (i) a temperature difference between the two surfaces results in heat flux through the interface, (ii) the object is a continuous piece of a material that has a thermal conductivity (often denoted k, k, or K) between the interface of about 200 W/mK to about 5000 W/mK, or (iii) the object is a continuous body of copper, or continuous body of aluminum. Examples of materials whose thermal conductivity is between aforementioned ranges include certain types of copper, aluminum, silver, or gold, for example.

As used herein the term "rest" may refer to aligning and placing a mounting element (for example, a protrusion) of the cooling component on a complementary mounting element (for example, a slot) or a non-complementary mounting element (for example, a surface) of the removable electronic device. As used herein the term "complementary mounting element" may refer to a surface profile of the complementary mounting element that is opposite or counter to that of a surface profile of the mounting element. As used herein the term "non-complementary mounting element" may refer to the surface profile of the complementary mounting element that is not opposite or not counter to that of the surface profile of the mounting element. As used herein the term "flexible arm" may refer to a cantilevered spring finger having a fixed end and a free end that is displaceable relative to the fixed end, on application of load. As used herein the term "displaceable" may refer to moving out/away the free end of the flexible arm from its relaxed state to the loaded state.

The present disclosure describes example implementations of a host electronic device and a method of establishing a thermal contact with a removable electronic device by a cooling component of the host electronic device. The host electronic device includes a housing, the cooling component, and a plurality of flexible arms. The cooling component is movably coupled to the housing. The plurality of flexible arms extend towards an internal cavity of the housing to hold the cooling component in a first position (retracted position). Further, the plurality of flexible arms are displaceable from the internal cavity by a movement of the removable electronic device into the host electronic device, to allow the cooling component to drop down to a second position (extended position) for establishing the thermal contact with a heat generating component of the removable electronic device.

For purposes of explanation, certain examples are described with reference to the components illustrated in FIGS. 1-5. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Further, the sequence of operations described in connection with FIGS. 4A-4O and 5 is an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

A removable electronic device, for example, a communication device or a storage drive may be a hot-pluggable electronic device or drive used for transferring, receiving, processing, or storing data. In some examples, the communication device, for example, a transceiver when connected to a host electronic device, such as a networking device may convert electrical signals into optical signals or vice versa for transmitting or receiving data. Accordingly, the transceiver may consume a greater amount of power to convert the signals, and thereby produce excessive waste-heat. In some other examples, the storage device, for example, a non-volatile memory express (NVMe) storage drive, when connected to the host electronic device such as the server device, may process, store, or transfer data. Accordingly, the NVMe storage drive may consume a greater amount of power to process, store, or transfer data, and thereby produce excessive waste-heat.

In such examples, if the excessive waste-heat produced by the removable electronic device is not adequately dissipated, it may degrade the removable electronic device's performance, reliability, and/or life expectancy and may also cause its failure. Accordingly, a heat sink that is thermally coupled to a heat generating component of the removable electronic device may be used to dissipate the waste-heat from the removable electronic device, and a cooling air passing over the heat sink may be used to remove the waste-heat from the heat sink. However, when the removable electronic device is connected to the host electronic device, the heat sink may not receive adequate supply of the cooling air to remove the waste-heat from the heat sink. Thus, the host electronic device may provide a cooling component for removing the waste-heat from the heat sink. In such examples, the cooling component may establish a thermal interface (or thermal contact) with the heat sink to transfer the waste-heat from the heat sink to the cooling component for removing the waste-heat from the heat sink. However, maintaining the thermal contact between the cooling component and the heat sink (i.e., between two interfacing surfaces) may be difficult, as the interfacing surfaces may not have flat and/or smooth surfaces. Also, the accumulation of debris and/or surface imperfections (i.e., scratches, dents, or the like) may compromise the heat transfer between the interfacing surfaces. Further, it may be difficult to generate an optimal contact force/pressure to maintain the thermal contact between the interfacing surfaces.

In order to address the aforementioned issues, a thermal interfacing material, such as a thermal gap pad, a thermal grease, a thermal foam, thermally conductive spring fingers, or the like may be used in-between the interfacing surfaces. For example, the thermal interfacing material may be coupled to the cooling component for establishing the thermal contact with the heat sink, when the removable electronic device is connected to the host electronic device. In such examples, the heat sink may have to slide through the entire thermal interfacing material during connecting and/or disconnecting of the removable electronic device. Thus, damaging the thermal interfacing material may occur, especially when the thermal interfacing material is small in size and/or fragile in nature. Further, repetitive connecting and/or disconnecting of the removable electronic device may result in peeling off/damaging the thermal interfacing material over a period of time. Similarly, repetitive connecting and/or disconnecting of the removable electronic device may make the thermal interfacing material such as the thermal grease messy, and may cause the thermal interfacing material to be easily scraped off from the host electronic device. Further, the thermal interfacing material may exert a contact force opposing an insertion force applied to connect the removable electronic device to the host electronic device or a removal force applied to disconnect the removable electronic device from the host electronic device. In such examples, maintaining an optimal contact force, which is within acceptable safety limits to avoid repetitive force (e.g., insertion force or removal force) related damage is extremely difficult. Further, the cooling component having a thermal interfacing material may be directly exposed to an external environment when the removable electronic device is not connected to the host electronic device, or when a hollow cavity of the host electronic device is left empty. This may result in accumulation of foreign objects, debris, or the like, on the thermal interfacing material, thereby damaging the thermal interfacing material.

A technical solution to the aforementioned problems include presenting a host electronic device having a cooling component that is movable for providing a non-interfering path for a movement of a removable electronic device into the host electronic device and/or from the host electronic device. In other words, the cooling component is movable to allow connecting of the removable electronic device into the host electronic device and/or disconnecting of the removable electronic device from the host electronic device, without contacting a thermal interfacing material of the cooling component. For example, the cooling component may be held in a first position (retracted position) during movement of the removable electronic device into the host electronic device and/or movement of the removable electronic device from the host electronic device. Similarly, the cooling component may be held in a second position (extended position) when the removable electronic device is connected to the host electronic device, for establishing a thermal contact with the removable electronic device. Therefore, the removable electronic component may not slide through the thermal interfacing material during connecting and/or disconnecting of the removable electronic device from the host electronic device, thereby protecting the thermal interfacing material from the possible damage caused by the movement of the removable electronic device. Further, the removable electronic device may be easily connected and disconnected into and/or from the host electronic device, since the cooling component does not interfere with the movement of the removable electronic device, thereby preventing repetitive force (e.g., insertion force or removal force) related damage.

In some examples, the cooling component may be held in the first position by a plurality of flexible arms extending towards an internal cavity of the housing. In such examples, the removable electronic device may displace the plurality of flexible arms from the internal cavity during its movement into the host electronic device to allow the cooling component to drop down to the second position. However, the removable electronic device may continue to hold the cooling component in the first position by allowing a plurality of mounting elements of the cooling component to rest on a plurality of non-complementary mounting elements of the removable electronic device. In such examples, when the removable electronic device is connected to the host electronic device, the plurality of mounting elements of the cooling component may align and rest on a plurality of complementary mounting elements of the removable electronic device, thereby allowing the cooling component to drop down to the second position from the first position for establishing the thermal contact with the removable electronic device. Similarly, the removable electronic device may allow the cooling component to move up, and the plurality of mounting elements of the cooling component to rest on the plurality of non-complementary mounting elements to hold the cooling component in the first position, during the movement of the removable electronic device out of the host electronic device. In such examples, the removable electronic device may continue holding of the cooling component in the first position, until the plurality of flexible arms restores into the internal cavity to hold the cooling component in the first position.

In some examples, the host electronic device has a plurality of biasing members interposed between and coupled to the cooling component and the housing. In such examples, the plurality of biasing members are in a compressed state when the cooling component is held in the first position by the plurality of flexible arms and/or the removable electronic device. Further, the plurality of biasing members are in a relaxed state when the cooling component is held in the second position. In other words, the plurality of biasing members may apply a biasing force on the cooling component to move it to the second position for establishing the thermal contact with the removable electronic device, when it is connected to the host electronic device.

FIG. 1 depicts an exploded perspective view of a computing system 100 having a host electronic device 102 and a removable electronic device 104. In some examples, the computing system 100 is a compute infrastructure having the host electronic device 102, such as a server device, a storage device, a power conversion device, or a networking device, and the removable electronic device 104, such as a data communication device, or a storage drive. In the example of FIG. 1, the host electronic device 102 is a networking device having a switch, and the removable electronic device 104 is a data communication device having a transceiver. In some examples, the switch may be an Ethernet switch and the transceiver may be a small form-factor pluggable (SFP) transceiver or a Quad small form-factor pluggable (QSFP) transceiver. In some other examples, other types of the host electronic device 102, such as a server device, a storage device, a power conversion device, or the like, may be envisioned without deviating from the scope of the present disclosure. Similarly, other types of the removable electronic device 104, such as the storage drive, for example, a non-volatile memory express (NVMe) storage drive, or the like may be envisioned without deviating from the scope of the present disclosure.

The computing system 100 may include a containment box (not shown) attached to a rack, to house the host electronic device 102. In such examples, the containment box may further include one or more openings to provision insertion and/or removal of the host electronic device 102 into and/or from the computing system 100 via a corresponding opening in the containment box. In some examples, the containment box may be an integral part of the computing system 100 or may be a modular component, which may be attached/coupled to the rack of the computing system 100. As discussed herein, the computing system 100 includes the host electronic device 102 and the removable electronic device 104. It may be noted herein that FIG. 1 represents an exploded perspective view of the host electronic device 102, and an assembled perspective view of the removable electronic device 104.

The host electronic device 102 includes a housing 106, a cooling component 108, a plurality of flexible arms 110, a plurality a biasing members 112, a fluid conduit 114, and a receptacle 116. The host electronic device 102 may further include a host circuit board (not shown) coupled to the receptacle 116.

In some examples, the housing 106 may be a hollow component having an internal cavity 118 (shown in FIG. 2A) to house a plurality of components of the host electronic device 102. The plurality of components may include the cooling component 108, the plurality of flexible arms 110, the plurality of biasing members 112, the fluid conduit 114, and the receptacle 116. In some examples, the housing 106 may be formed of a container portion 106A and a cover portion 106B. In such examples, the cover portion 106B may be disposed on and coupled to the container portion 106A to define the internal cavity 118 there between.

Referring to FIGS. 1, 2A, and 2B, the container portion 106A may be a box shaped component defined by a plurality of peripheral walls 120, a front panel 122, a rear panel 124, and a base 126. In such examples, the plurality of peripheral walls 120 are spaced apart from one another and coupled to the front panel 122, the rear panel 124, and the base 126 to form the internal cavity 118 of the housing 106. Further, each peripheral wall 120 has a plurality of window openings 128 providing access to the internal cavity 118 from an exterior of the housing 106. The plurality of window openings 128 are disposed spaced apart from one another. In the example of FIG. 2A, each peripheral wall 120 has three numbers of window openings 128. Further, the front panel 122 has an inlet opening 130 for receiving the removable electronic device 104. The rear panel 124 has an outlet opening 132 for receiving a portion of the receptacle 116 of the host electronic device 102.

Each flexible arm 110 is a cantilever spring finger extending from an inner surface 134 of each peripheral wall 120 towards the internal cavity 118 of the housing 106. In some examples, each flexible arm 110 may have a fixed end 110A, a free end 110B, and a body portion 110O interconnecting the fixed and free ends 110A, 110B respectively, to one another. In such examples, the fixed end 110A may be connected to the inner surface 134, the body portion 110B may extend from the fixed end 108A towards the internal cavity 118, and the free end 110B may partially loop back towards the inner surface 134. Thus, defining a curved shaped profile (for example, a concave shaped profile) to each flexible arm 110. Further, each flexible arm 110 is positioned inside the container portion 106A at a corresponding window opening of the plurality of window openings 128. For example, the fixed end 110A of each flexible arm 110 extends from one end portion 128A of the window opening 128. Further, the free end 110B of each flexible arm 110 is positioned proximate to another mutually opposite end portion 128B of the window opening 128. In the example of FIG. 2A, each of the plurality of flexible arms 110 is in a relaxed state, thus allowing the cooling component 108 to rest on them, and hold the cooling component 108 in a first position (retracted position). Further, each of the plurality of flexible arms 110 may be displaceable upon application of load, so as to move to a stretched position. In one or more examples, the load may be in a form of an insertion force applied on the removable electronic device 104 for a movement of the removable electronic device 104 into the host electronic device 102. In some examples, the plurality of flexible arms 110 may move away from the internal cavity 118 to the exterior of the housing 106 via the corresponding window opening 128 due to the movement of the removable electronic device 104 into the host electronic device 102, and thereby allowing the cooling component 108 to drop down to a second position (extended position).

In the example of FIGS. 2A and 2B, the plurality of flexible arms 110 are integrated to the corresponding peripheral wall 120 of the housing 106 to form a unitary housing component. As used herein the term "unitary housing component" may refer to a single or one-piece component. In some other examples, the plurality of flexible arms 110 and the housing 106 may be discrete components. In such examples, each flexible arm 110 may be coupled to the plurality of peripheral side walls 120 of the housing 106 by using a standard coupling mechanism, such as welding, soldering, or the like.

Referring to FIGS. 1, and 2C, the cover portion 106B of the housing 106 may have a plurality of peripheral walls 136, a lip wall 138, a rear wall 140, and a lid 142. In such examples, the plurality of peripheral walls 136 may be coupled to the lip wall 138, the rear wall 140, and the lid 142 to form another hollow cavity 144 there between. In some examples, the lip wall 138 may have a length greater than a length of the rear wall 140 and the plurality of peripheral walls 136 in order to cover a thermal interfacing material 156 (shown in FIG. 3A) of the cooling component 108 from an external environment, when the cooling component 108 is held in the first position (retracted position).

In some examples, the plurality of biasing members 112, for example, coil springs are spaced apart from one another and coupled to the lid 142. In the example embodiment of FIG. 2O, the host electronic device 102 includes nine numbers of the biasing members 112. In some examples, one end portion of each biasing member 112 is coupled to an inner surface 146 of the lid 142 and another end portion of each biasing member 112 is coupled to an outer surface 150 (shown in FIG. 1) of the cooling component 108 (as shown in FIGS. 1, and 4A to 4C). In other words, the plurality of biasing members 112 may be interposed between the cooling component 108 and the lid 142 of the housing 106 and coupled to the lid 142 and the cooling component 108. In some examples, the plurality of biasing members 112 may move to a compressed state to move up the cooling component 108 and hold the cooling component 108 in the first position. Further, the plurality of biasing members 112 may apply a biasing force on the cooling component 108 to drop down the cooling component 108 and hold the cooling component 108 in the second position for establishing thermal contact with the removable electronic device 104.

Referring to FIGS. 1, and 2D and 2E, the cooling component 108 in some examples, is a cold plate. For example, the cooling component 108 is a liquid-cooling component having the fluid conduit 114 disposed in and attached to channel 148 that is formed on the outer surface 150 of the cooling component 108. The fluid conduit 114 may be in thermal communication (i.e., thermally coupled) with the cooling component 108. As shown in the example of FIGS. 1 and 2D, the fluid conduit 114 may have a "U" shaped profile having a fluid inlet 152 and a fluid outlet 154. In such examples, the fluid inlet 152 may be in a fluid communication with a pump (not shown) of the computing system 100, and the fluid outlet 154 may be in fluid communication with a coolant distribution unit (CDU, not shown) of the computing system 100. Accordingly, the fluid inlet 152 may receive a coolant liquid from the pump, circulate the coolant liquid through the fluid conduit 114 for absorbing a waste-heat (transferred to the cooling component 108 from the removable electronic device 104) and generating a heated liquid. In such example, the fluid outlet 154 may direct the heated liquid to the CDU for regenerating the coolant liquid and directing the regenerated coolant liquid to the pump. In some examples, the cooling component 108 and the fluid conduit 114 may include a thermally conductive material, for example, a copper material, an aluminum material, or the like.

As shown in FIG. 2D, the cooling component 108 further includes a thermal interfacing material 156 coupled to an inner surface 158 of the cooling component 108 using thermal conductive soldering materials. In one or more examples, the thermal interfacing material 156 may be at least one of a thermal gap pad, a thermal grease, a thermal foam, or a plurality of thermal conductive spring fingers. In the example of FIG. 2D, the thermal interfacing material 156 is a thermal gap pad. In one or more examples, the thermal interfacing material 156 may overcome the issues related to the inner surface 158 of the cooling component 108 not having a smooth or a flat surface for establishing a thermal contact with the removable electronic device 104. The thermal interfacing material 156 has a first thickness "$T_1$". In some examples, the thermal interfacing material 156 may include the thermally conductive material, for example, a copper material, an aluminum material, or the like.

The cooling component 108 has a plurality of mounting elements 160 formed on the inner surface 158. For example, the plurality of mounting elements 160 are spaced apart from one another, and formed along each peripheral wall of a plurality of peripheral walls 162 of the cooling component 108. In the example of FIGS. 2D and 2E, the cooling component 108 has three number of mounting elements on each peripheral wall 162. The plurality of mounting elements 160 have first widths "$W_1$" that are gradually reduced along a direction 164 (i.e., first direction) of a movement of the removable electronic device 104 into the host electronic device 102. For example, the plurality of mounting elements 160 formed along each peripheral wall 162 has gradually reduced first widths "$W_1$" along the first direction 164. Further, each of the plurality of mounting elements 160 has a second thickness "$T_2$". In one or more examples, the second thickness "$T_2$" is substantially greater than the first thickness "$T_1$". As shown in FIGS. 2D and 2E, each mounting element 160 is a protrusion. In some other examples, each mounting element 160 may be a slot depending on a complementary mounting element 186 (shown in FIGS. 3A and 3B) formed on the removable electronic device 104.

Figure 2F:
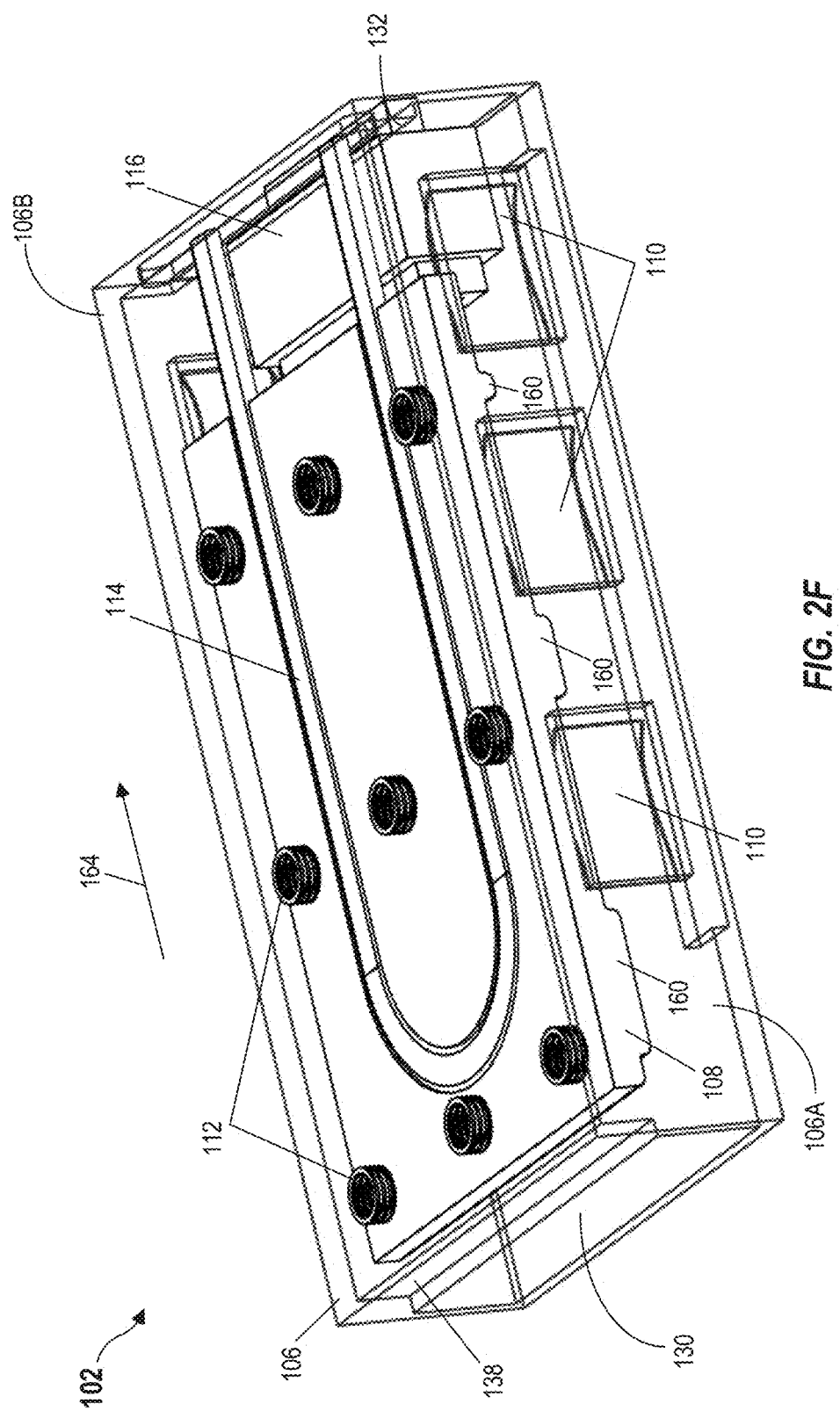
FIG. 2F illustrates an assembled perspective view of the host electronic device of FIG. 1 according to an example implementation of the present disclosure.

FIG. 2F depicts an assembled perspective view of the host electronic device 102. As discussed herein, the host electronic device 102 includes a housing 106, a cooling component 108, a plurality of flexible arms 110, a plurality of biasing members 112, a fluid conduit 114, and a receptacle 116. The housing 106 includes a container portion 106A and a cover portion 106B, as shown in the example of FIGS. 2A, 2B, 2C. It may be noted herein, that the cover portion 106B is shown as a transparent structure in the example of FIG. 2F so as to depict other assembled components of the host electronic device 102, such as the cooling component 108, the plurality of biasing members 112, the fluid conduit 114, and the receptacle 116, and such an illustration should not be construed as a limitation of the present disclosure. A portion of the receptacle 116 is disposed within and coupled to the outlet opening 132 formed on the container portion 106A of the housing 106. The receptacle 116 faces the inlet opening 130 for receiving and connecting to a connector 172 (shown in FIGS. 3A and 3B) of the removable electronic device 104. The plurality of flexible arms 110 are disposed within the container portion 106A such that each flexible arm 110 extends towards an internal cavity 118 of the housing 106.

The plurality of biasing members 112 are disposed spaced apart from one another on an inner surface 146 of the cover portion 106B of the housing 106. In such examples, a first end (not labeled) of each biasing member 112 is coupled to the inner surface 146 of the cover portion 106B and a second end (not labeled) of each biasing member 112 is coupled to an outer surface 150 of the cooling component 108. In other words, the plurality of biasing members 112 are interposed between the cover portion 106B and the cooling component 108. In such examples, the fluid conduit 114 is disposed on and coupled to a channel 148 formed on the outer surface 150 of the cooling component 108. The cover portion 106B is later disposed on and coupled to the container portion 106A such that the lip wall 138 disposed at a top portion of the housing 106 covers a portion of the inlet opening 130, and the plurality of peripheral walls 136 of the cover portion 106B rest on the plurality of peripheral walls 120 of the container portion 106A, Thus, when the cover portion 106E rest on the container portion 106A, the plurality of flexible arms 110 extending towards the internal cavity 118 of the container portion 106A holds the cooling component 108 in a first position. In such examples, the plurality of biasing members 112 are pushed to a compressed state by the plurality of flexible arms 110 holding the cooling component 108 in the first position. The plurality of mounting elements 160 and the plurality of flexible arms 110 are alternately positioned along the direction 164 of the movement of the removable electronic device 104 into the host electronic device 102. The host electronic device 102 may further include a host circuit board (not shown) communicatively coupled to the receptacle 116 for receiving and/or transmitting data.

FIG. 3A depicts an assembled perspective view of the removable electronic device 104 of FIG. 1. 3B depicts a side view of the removable electronic device 104 of FIG. 3A. Referring to FIGS. 1, 3A, and 3B, the removable electronic device 104 includes an electromagnetic induction (EMI) casing 166, a heat generating component 168, such as a circuit board (not shown) and a plurality of electronic components (not shown), a heat spreader 170, and a connector 172.

The EMI casing 166 has a plurality of peripheral walls 176, a front panel 178 having the connector 172, a rear panel 180 having a handle 182, and a hollow chamber 184. The circuit board is disposed within the hollow chamber 184 and the plurality of electronic components are mounted on the circuit board. Further, the circuit board is communicatively coupled to the connector 172. In some examples, the EMI casing 166 may shield the circuit board and the plurality of electronic components from EMI emissions and improve the reliability of the removable electronic device 104.

In some examples, the heat spreader 170 is a heat sink. The heat spreader 170 is also disposed in the hollow chamber 184 such that the heat spreader 170 is in a thermal contact with the heat generating component 168. For example, the heat spreader 170 may be coupled to at least one or more electronic components and the portion of the circuit board. The heat spreader 170 is configured to dissipate a waste-heat from the heat generating component 168 to an outer surface 174 of the heat spreader 170. In some examples, the heat spreader 170 may include a vapor chamber filled with a coolant liquid. In one or more examples, the heat spreader 170 may include the thermally conductive material, for example, the copper material, the aluminum material, or the like.

The removable electronic device 104 includes a plurality of complementary mounting elements 186 and a plurality of non-complementary mounting elements 188 disposed along each peripheral wall 176 of the EMI casing 166. For example, the plurality of complementary mounting elements 186 and the plurality of non-complementary mounting elements 188 are disposed alternately along each peripheral wall 176. The plurality of complementary mounting elements 186 have second widths "$W_2$" that are gradually increased along another direction 190 (i.e., second direction) opposite to the direction 164 (first direction) of the movement of the removable electronic device 104 into the host electronic device 102. In one or more examples, corresponding widths of the first widths "$W_1$" and the second widths "$W_2$" are substantially equal. As shown in FIGS. 3A and 3B, each complementary mounting element 186 is a slot. In some other examples, each complementary mounting element 186 may be a protrusion depending on the mounting element 160 (shown in FIGS. 2D and 2E) formed on the cooling component 108. In other words, each of the plurality of mounting elements 160 of the cooling component 108 includes one of a protrusion or a slot, and each of the plurality of complementary mounting elements 186 of the removable electronic device 104 includes the other one of a protrusion or a slot. Further, each of the plurality of complementary mounting elements 186 has a third thickness "$T_3$". In one or more examples, the third thickness "$T_3$" is substantially equal to that of the second thickness "$T_2$" of each of the plurality of mounting elements 160. Further, in the example of FIGS. 3A and 3B, each of the plurality of non-complementary mounting elements 188 includes a flat surface.

In one or more examples, when the removable electronic device 104 is moved (slidably inserted) into the host electronic device 102, the connector 172 of the removable electronic device 104 is connected to the receptacle 116 of the host electronic device 102. In such examples, the circuit board of the removable electronic device 104 is communicatively coupled to the host circuit board of the host electronic device 102 via the connector 172 and the receptacle 116.

FIG. 4A depicts a block diagram of the computing system 100 of FIG. 1 having the removable electronic device 104 connecting to the host electronic device 102. As discussed herein, the plurality of flexible arms 110 extends towards the internal cavity 118 to hold the cooling component 108 in a first position 200 (i.e., retreated position) and provide a non-interrupting (or non-interfering) path for a movement of the removal electronic device 104 into the host electronic device 102 along a first direction 164 for connecting to the host electronic device 102. In other words, the thermal interfacing material 156 (shown in FIG. 2D) may not interfere (or not contact) with the movement of the removable electronic device 104 into the host electronic device 102. In such examples, the plurality of biasing members 112 are pushed to a compressed state, as the plurality of flexible arms 110 hold the cooling component 108 in the first position 200.

When an insertion force is applied on the removable electronic device 104 along the first direction 164, the removable electronic device 104 starts to move inside the internal cavity 118 of the host electronic device 102 via the inlet opening 130. In such examples, the front panel 178 of the removable electronic device 104 contacts a pair of flexible arms of the plurality of flexible arms 110 in series along the first direction 164. In other words, the front panel 178 may contact one pair of flexible arms at a time (i.e., a first pair of flexible arms followed by a second pair of flexible arms, and so on along the first direction 164). As the insertion force is further applied on the removable electronic device 104, the front panel 178 displaces each pair of flexible arms 110 from the internal cavity 118 to an exterior of the host electronic device 102 via a corresponding window opening 128. Thereby, permitting the cooling component 108 to drop down along a vertical direction 192 (shown in FIG. 4B). However, the pair of mounting elements of the plurality of mounting elements 160 rest on a corresponding pair of non-complementary mounting elements of the plurality of non-complementary mounting elements 188 when the pair of flexible arms 110 are displaced from the internal cavity 118, to continue holding the cooling component 108 in the first position 200. Since, the first widths "$W_1$" of the pair of mounting elements 160 are gradually reduced along the first direction 164, and the second widths "$W_2$" of the pair of complementary mounting elements 186A are gradually increased along the second direction 190, the pair of mounting elements 160 may not seat on the pair of complementary mounting elements 186, until when the removable electronic device 104 is fully inserted into the host electronic device 102 or when the connector 172 is connected to the receptacle 116. Thereby, allowing a seamless movement of the removable electronic device 104 into the host electronic device 102 without contacting the thermal interfacing material 156 of the cooling component 108.

FIG. 4B depicts a block diagram of the computing system 100 of FIG. 1 having the removable electronic device 104 connected to the host electronic device 102. In the example of FIG. 4B, the removal electronic device 104 is fully inserted or plugged into the host electronic device 102, such that the connector 172 is connected to the receptacle 116. In such examples, each pair of flexible arms of the plurality of flexible arms 110 are displaced from the internal cavity 118. Further, each pair of mounting elements of the plurality of mounting elements 160 align and rest on a corresponding pair of complementary mounting elements of the plurality of complementary mounting elements 186, to allow the cooling component 108 to drop down to a second position 202 along the vertical direction 192. Further, the plurality of biasing members 112 apply a biasing force on the cooling component 108 so as to move and hold the cooling component 108 in the second position 202 for establishing a thermal contact with the heat generating component 168 of the removable electronic device 104. For example, the thermal interfacing material 156 coupled to the cooling component 108, may establish the thermal contact with the heat spreader 170 of the removable electronic device 104. It may be noted herein that the plurality of biasing members 112 move to a relaxed state in order to hold the cooling component 108 in the second position 202.

In some examples, a first thermal conduction path is established between the heat generating component 168 and the heat spreader 170, so as to transfer a waste-heat from the heat generating component 168 to the heat spreader 170. Further, a second thermal conduction path is established between the heat spreader 170 and the cooling component 108 via the thermal interfacing material 156, so as to dissipate the waste-heat from the heat spreader 170 to the cooling component 108. Later, a third thermal conduction path is established between the cooling component 108 and a coolant liquid (not shown) circulating in the fluid conduit 114 so as to transfer the waste-heat from the cooling component 108 to the liquid coolant and generate a heated liquid (not shown). As discussed herein, the heated liquid is directed to the CDU (not shown) to regenerate the coolant liquid.

Figure 4C:
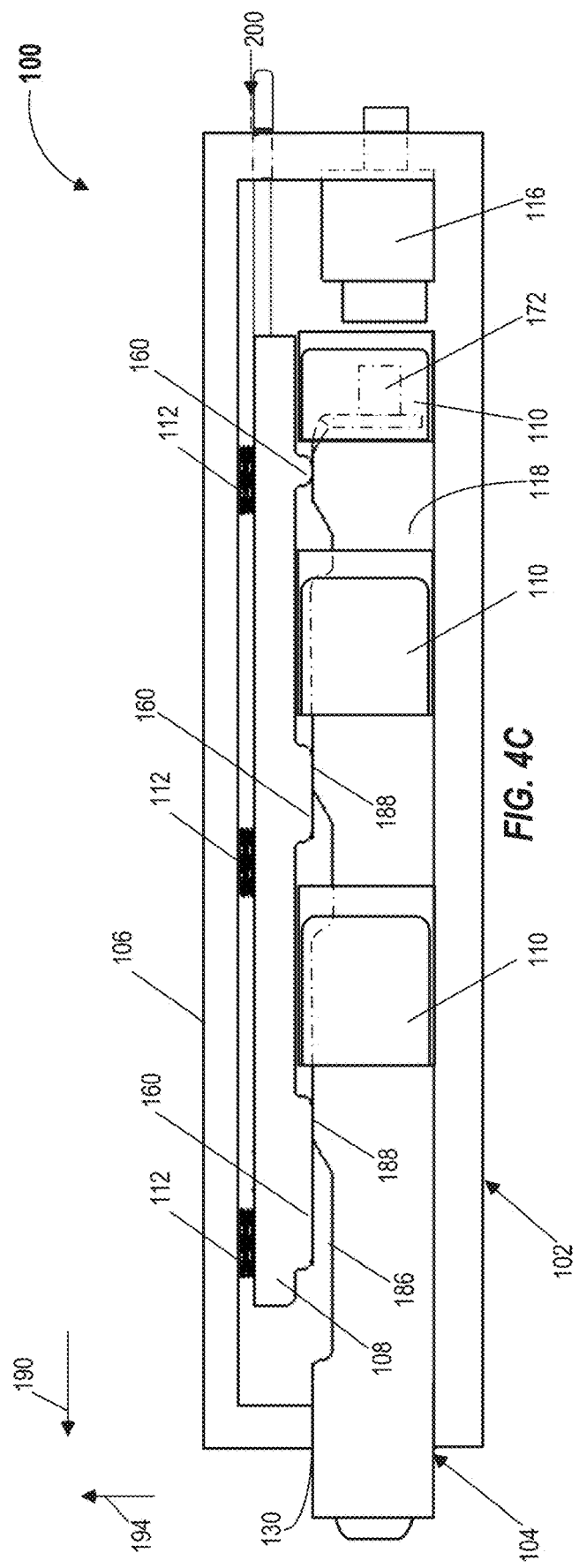
FIG. 4C illustrates a block diagram of the computing system of FIG. 1 having the removable electronic device disconnecting from the host electronic device according to an example implementation of the present disclosure.
Figure 5:
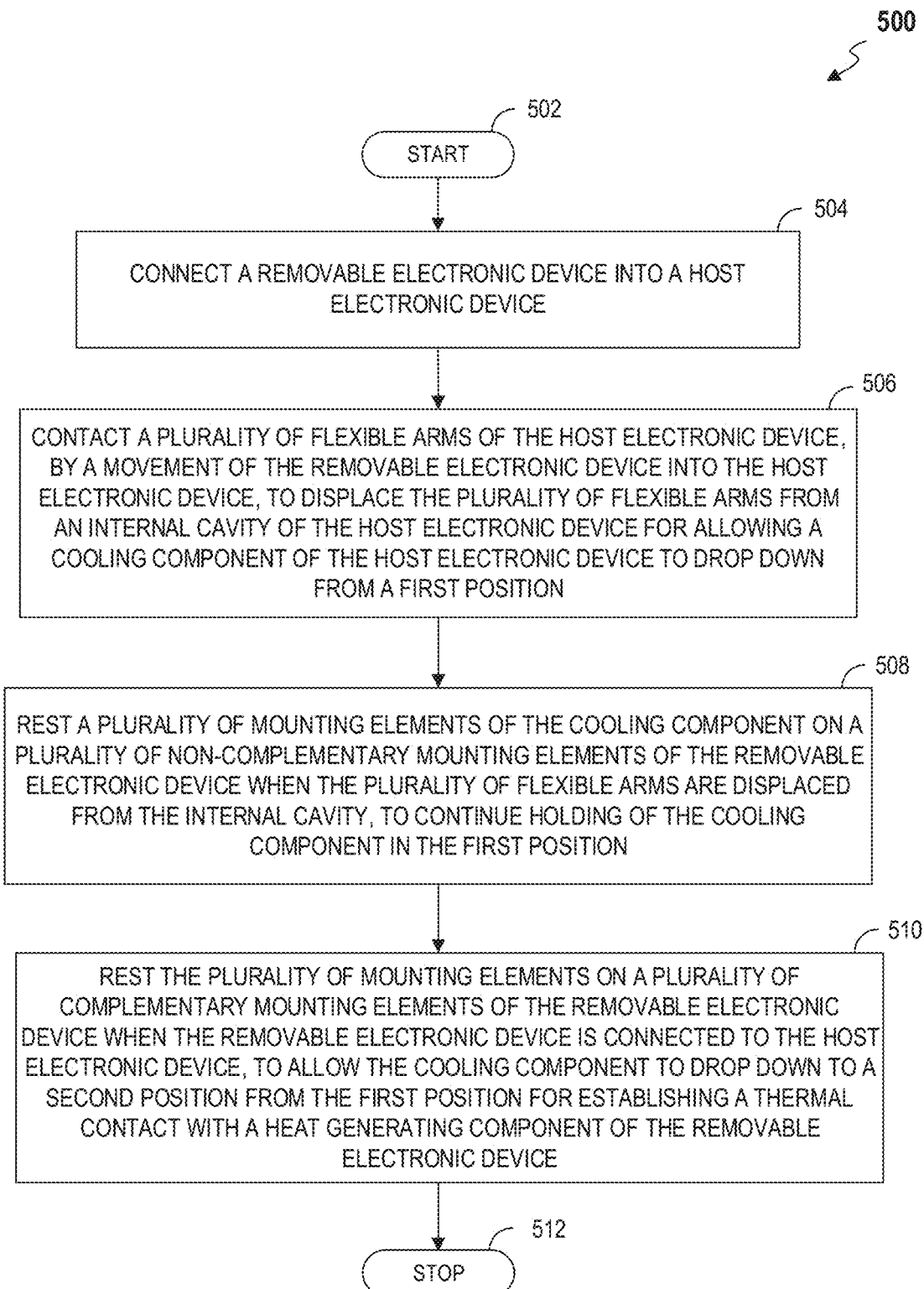
FIG. 5 illustrates a flowchart depicting a method of connecting a removable electronic device into a host electronic device according to an example implementation of the present disclosure.

FIG. 4C illustrates a block diagram of the computing system 100 of FIG. 1 having the removable electronic device 104 disconnecting from the host electronic device 102. When a removal force is applied on the removable electronic device 104 along the second direction 190 opposite to the first direction 164, the removable electronic device 104 starts to move outside the internal cavity 118 of the host electronic device 102 via the inlet opening 130. In such examples, the connector 172 gets disconnected from the receptacle 116. The removal force applied on the removable electronic device 104 may allow the cooling component 108 to move up along another vertical direction 194 opposite to the vertical direction 192 (shown in FIG. 4B) to move the cooling component 108 to the first position 200. Thus, the thermal interfacing material 156 may disconnect the thermal contact established with the heat spreader 170 when the removable electronic device 104 is moved outside the host electronic device 102. Further, the pair of mounting elements of the plurality of mounting elements 160 rest on the corresponding pair of non-complementary mounting elements of the plurality of non-complementary mounting elements 188 to hold the cooling component 108 in the first position 200, In one or more examples, the removable electronic device 104 may continue holding the cooling component 108 in the first position 200, until each pair of flexible arms of the plurality of flexible arms 110 are restored back, towards the internal cavity 118 so as to hold the cooling component 108 in the first position 194. In other words, the removable electronic device 104 may continue holding the cooling component 108 until the removable electronic device 104 is completely removed from the internal cavity 118 of the host electronic device 102 and the plurality of flexible arms 110 are restored towards the internal cavity 118 to hold the cooling component 108. In such examples, the plurality of biasing members 112 are initially pushed back to the compressed state by the removable electronic device 104 and later by the plurality of flexible arms 110 so as to hold the cooling component 108 in the first position 200.

Referring to FIGS. 4A, 4B, and 4C, the thermal interfacing material 156 may not interfere (or interrupt) with the movement of the removable electronic device 104 into and/or from the host electronic device 102, thereby preventing the possible damage to the thermal interfacing material 156 by the movement of the removable electronic device 104 into the host electronic device 102. Further, the removable electronic device 104 may be easily connected into and disconnected from the host electronic device 102, since the cooling component 108 does not interfere with the movement of the removable electronic device 104, thereby preventing repetitive force (e.g., insertion force or removal force) related damage. Further, the lip wall 138 disposed at the inlet opening 130 of the housing 106 covers the thermal interfacing material 156 of the cooling component 108 in the retracted position, from the external environment. Thereby, prevents the possible damage to the thermal interfacing material 156 from the foreign objects.

Referring back to FIG. 4B, during operation of the computing system 100, the plurality of electronic components of the removable electronic device 104 may transmit, receive, process, or store data. Accordingly, the removable electronic device 104 may consume a greater amount of power, and may thereby produce an increased amount of the waste-heat. In such examples, the heat spreader 170 coupled to the plurality of electronic components and the circuit board may dissipate the waste-heat from those devices towards the outer surface 174 of the removable electronic device 104. The thermal interfacing material 156, which is in thermal contact with the outer surface 174 of the heat spreader 170, transfers the dissipated waste-heat from the removable electronic device 104 to the cooling component 108 of the host electronic device 102. The coolant liquid circulating in the fluid conduit 114 with the cooling component 108 may absorb the waste-heat from the cooling component 108 and generate heated coolant (not labeled), thereby cooling the cooling component 108. The heated coolant liquid may be pumped outside of the computing system 100 to the CDU for exchanging the heat with an external coolant (not shown) and regenerate the coolant liquid.

FIG. 5 is a flow diagram depicting a method 500 of connecting a removable electronic device into a host electronic device. It should be noted herein that the method 500 is described in conjunction with FIGS. 1 and 4A-4C, for example.

The method 500 starts at block 502 and continues to block 504. At block 504, the method 500 includes connecting the removable electronic device into the host electronic device, as described in FIGS. 1 and 4A. In some examples, the host electronic device includes a housing, a cooling component movably coupled to the housing, and a plurality of flexible arms extending towards an internal cavity of the housing to hold the cooling component in a first position. In such examples, the cooling component is movably coupled to the housing by a plurality of biasing members. In other words, the plurality of biasing members are interposed between and coupled to the cooling component and the housing. In such examples, the plurality of biasing members are in a compressed state, as the plurality of flexible arms are holding the cooling component in the first position.

Further, the method 500 continues to block 506. At block 506, the method 500 includes the step of contacting the plurality of flexible arms by a movement of the removable electronic device into the host electronic device, to displace the plurality of flexible arms from the internal cavity for allowing the cooling component to drop down from the first position, as described in FIGS. 1 and 4A. In some examples, each pair of flexible arms may displace from the internal cavity to an exterior of the housing so as to allow the cooling component to drop down from the first position. The method 500 continues to block 508.

At block 508, the method 500 includes resting a plurality of mounting elements of the cooling component on a plurality of non-complementary mounting elements of the removable electronic device when the plurality of flexible arms are displaced from the internal cavity, to continue holding of the cooling component in the first position, as described in FIGS. 1 and 4A. The method 500 continues to block 510.

At block 510, the method 500 includes resting the plurality of mounting elements on a plurality of complementary mounting elements of the removable electronic device when the removable electronic device is connected to the host electronic device, to allow the cooling component to drop down to a second position from the first position for establishing a thermal contact with a heat generating component of the removable electronic device, as described in FIGS. 1 and 4B. In some examples, the plurality of biasing members moves and holds the cooling component to the second position for establishing the thermal contact there between the cooling component and the heat generating elements via the thermal interfacing material. In such examples, the plurality of biasing members are in a relaxed state holding the cooling component in the second position. In such examples, a waste-heat generated by the heat generating components is first transferred from a heat spreader thermally coupled to the heat generating components, to the cooling component via the thermal interfacing material. Further, the waste-heat is dissipated from the cooling component by coolant liquid circulating in a fluid conduit that is thermally coupled to the cooling component.

The method 500 may further includes a step of resting the plurality of mounting elements on the plurality of non-complementary mounting elements by the movement of the removable electronic device out of the host electronic device, as described in FIGS. 1 and 4*a* Thus, allowing the cooling component to move up to the first position and continue holding of the cooling component in the first position until the plurality of flexible arms extends back towards the internal cavity to hold the cooling component in the first position. The method 500 ends at block 512.

Various features as illustrated in the examples described herein may be implemented in a system, such as a host electronic device and method of establishing a thermal contact with a removable electronic device by a cooling component of the host electronic device when the removable electronic device is connected to the host electronic device. In one or more examples, a thermal interfacing material may not interfere (or interrupt) with a movement of the removable electronic device into and/or from the host electronic device, thereby preventing the possible damage to the thermal interfacing material by the movement of the removable electronic device into the host electronic device. Further, the removable electronic device may be easily connected into and disconnected from the host electronic device, since the cooling component does not interfere with the movement of the removable electronic device, thereby preventing repetitive force (e.g., insertion force or removal force) related damage. Further, the lip wall of the housing disposed at an inlet opening in the housing may cover the thermal interfacing material of the cooling component in the retracted position from the external environment, thereby preventing the possible damage to the thermal interfacing material from the foreign objects.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A host electronic device comprising:
a housing;
a cooling component movably coupled to the housing; and
a plurality of flexible arms extending towards an internal cavity of the housing to hold the cooling component in a first position, wherein the plurality of flexible arms are displaceable from the internal cavity by a movement of a removable electronic device into the host electronic device; to allow the cooling component to drop down to a second position for establishing a thermal contact with a heat generating component of the removable electronic device.

2. The host electronic device of claim 1, wherein the cooling component comprises a plurality of mounting elements that rest on a plurality of non-complementary mounting elements of the removable electronic device when the plurality of flexible arms are displaced from the internal cavity, to continue holding of the cooling component in the first position.

3. The host electronic device of claim 2; wherein the plurality of mounting elements rest on a plurality of complementary mounting elements of the removable electronic device when the removable electronic device is connected to the host electronic device, to allow the cooling component to drop down to the second position.

4. The host electronic device of claim 3, wherein the plurality of mounting elements rest on the plurality of non-complementary mounting elements by the movement of the removable electronic device out of the host electronic device, to allow the cooling component to move up to the first position and continue holding of the cooling component in the first position until the plurality of flexible arms extend back towards the internal cavity to hold the cooling component in the first position.

5. The host electronic device of claim 3, wherein the plurality of mounting elements have first widths that are gradually reduced along a direction of the movement of the removable electronic device into the host electronic device, wherein the plurality of complementary mounting elements have second widths that are gradually increased along another direction opposite to the direction of the movement of the removable electronic device into the host electronic device, and wherein corresponding widths of the first widths and the second widths are substantially equal.

6. The host electronic device of claim 3, wherein each of the plurality of mounting elements comprises one of a protrusion or a slot, and each of the plurality of complementary mounting elements comprises the other one of a protrusion or a slot.

7. The host electronic device of claim 2, wherein the plurality of mounting elements and the plurality of flexible arms are alternately positioned along a direction of the movement of the removable electronic device into the host electronic device.

8. The host electronic device of claim 1, further comprising a thermal interfacing material coupled to the cooling component, and wherein the cooling component establishes the thermal contact with the heat generating component of the removable electronic device via the thermal interfacing material.

9. The host electronic device of claim 8, wherein the housing comprises a lip wall disposed at a top portion of an inlet opening for covering the thermal interfacing material from an external environment.

10. The host electronic device of claim 1, further comprises a receptacle disposed at an outlet opening, facing an inlet opening of the housing, and wherein the receptacle receives a connector of the removable electronic device when the removable electronic device is connected to the host electronic device.

11. The host electronic device of claim 1, further comprising a plurality of biasing members interposed between the cooling component and the housing to allow the cooling component to be movably coupled to the housing, and wherein the plurality of biasing members apply biasing force to the cooling component to move from the first position to the second position for establishing the thermal contact with the heat generating component of the removable electronic device.

12. A computing system comprising:
   a host electronic device comprising:
      a housing;
      a cooling component movably coupled to the housing; and
      a plurality of flexible arms extending towards an internal cavity of the housing to hold the cooling component in a first position; and
   a removable electronic device comprising a heat generating component, that is detachably connectable to the host electronic device, wherein the removable electronic device displaces the plurality of flexible arms from the internal cavity by a movement of the removable electronic device into the host electronic device, to allow the cooling component to drop down to a second position for establishing a thermal contact with the heat generating component.

13. The computing system of claim 12, wherein the cooling component comprises a plurality of mounting elements, wherein the removable electronic device comprises a plurality of complementary mounting elements and a plurality of non-complementary mounting elements, wherein the plurality of mounting elements rest on the plurality of non-complementary mounting elements when the plurality of flexible arms are displaced from the internal cavity, to continue holding of the cooling component in the first position.

14. The computing system of claim 13, wherein the plurality of mounting elements rest on the plurality of complementary mounting elements when the removable electronic device is connected to the host electronic device, to allow the cooling component to drop down to the second position.

15. The computing system of claim 13, wherein the plurality of mounting elements rest on the plurality of non-complementary mounting elements by the movement of the removable electronic device out of the host electronic device to allow the cooling component to move up to the first position and continue holding of the cooling component in the first position until the plurality of flexible arms extends back towards the internal cavity to hold the cooling component in the first position.

16. The computing system of claim 13, wherein the plurality of mounting elements have first widths that are gradually reduced along a direction of the movement of the removable electronic device into the host electronic device, wherein the plurality of complementary mounting elements have second widths that are gradually increased along another direction opposite to the direction of the movement of the removable electronic device into the host electronic device, and wherein corresponding widths of the first widths and the second widths are substantially equal.

17. The computing system of claim 13, wherein the plurality of mounting elements and the plurality of flexible arms are alternately positioned along a direction of the movement of the removable electronic device to the host electronic device.

18. A method comprising: connecting a removable electronic device into a host electronic device, wherein the host electronic device comprises a housing, a cooling component movably coupled to the housing, and a plurality of flexible arms extending towards an internal cavity of the housing to hold the cooling component in a first position; wherein the plurality of flexible arms are displaceable from the internal cavity by a movement of a removable electronic device into the host electronic device, contacting the plurality of flexible arms by the movement of the removable electronic device into the host electronic device, to displace the plurality of flexible arms from the internal cavity for allowing the cooling component to drop down from the first position; resting a plurality of mounting elements of the cooling component on a plurality of non-complementary mounting elements of the removable electronic device when the plurality of flexible arms are displaced from the internal cavity, to continue holding of the cooling component in the first position; and resting the plurality of mounting elements on a plurality of complementary mounting elements of the removable electronic device when the removable electronic device is connected to the host electronic device, to allow the cooling component to drop down to a second position from the first position for establishing a thermal contact with a heat generating component of the removable electronic device.

19. The method of claim 18, further comprising resting the plurality of mounting elements on the plurality of non-complementary mounting elements by the movement of the removable electronic device out of the host electronic device, to allow the cooling component to move up to the first position and continue holding of the cooling component in the first position until the plurality of flexible arms extends back towards the internal cavity to hold the cooling component in the first position.

20. The method of claim 18, further comprising applying a biasing force using a plurality of biasing members, to the cooling component to move from the first position to the second position for establishing the thermal contact with the heat generating component, wherein the plurality of biasing members are interposed between the cooling component and the housing to allow the cooling component to be movably coupled to the housing.

* * * * *